United States Patent
Uncovsky et al.

(10) Patent No.: US 7,791,020 B2
(45) Date of Patent: Sep. 7, 2010

(54) MULTISTAGE GAS CASCADE AMPLIFIER

(75) Inventors: Marek Uncovsky, Brno (CZ); Milos Toth, Portland, OR (US); William Ralph Knowles, Forest Grove, OR (US)

(73) Assignee: FEI Company, Hillsboro, OR (US)

( * ) Notice: Subject to any disclaimer, the term of this patent is extended or adjusted under 35 U.S.C. 154(b) by 389 days.

(21) Appl. No.: 12/059,850

(22) Filed: Mar. 31, 2008

(65) Prior Publication Data
US 2009/0242758 A1    Oct. 1, 2009

(51) Int. Cl.
*H01J 37/244*    (2006.01)
*H01J 37/28*    (2006.01)
*H01J 37/252*    (2006.01)

(52) U.S. Cl. .............. 250/306; 250/307; 250/309; 250/310

(58) Field of Classification Search .......... 250/306, 250/307, 309–311, 336.1, 397, 398, 396 R, 250/492.3
See application file for complete search history.

(56) References Cited

U.S. PATENT DOCUMENTS

| | | | |
|---|---|---|---|
| 2,929,949 A | 3/1960 | Vincent | |
| 4,785,182 A | 11/1988 | Mancuso et al. | |
| 4,823,006 A | 4/1989 | Danilatos et al. | |
| 4,880,976 A | 11/1989 | Mancuso et al. | |
| 4,897,545 A | 1/1990 | Danilatos | |
| 4,992,662 A | 2/1991 | Danilatos | |
| 5,250,808 A | 10/1993 | Danilatos et al. | |
| 5,362,964 A * | 11/1994 | Knowles et al. | 250/310 |
| 5,396,067 A * | 3/1995 | Suzuki et al. | 250/310 |
| 5,412,211 A * | 5/1995 | Knowles | 250/310 |
| 5,828,064 A * | 10/1998 | Knowles | 250/310 |
| 5,945,672 A | 8/1999 | Knowles et al. | |
| 6,184,525 B1 * | 2/2001 | Van Der Mast | 250/310 |
| 6,365,896 B1 * | 4/2002 | van der Mast | 250/310 |
| 6,590,210 B1 | 7/2003 | Essers | |
| 6,707,041 B2 | 3/2004 | Essers | |
| 6,781,124 B2 | 8/2004 | Hayn | |
| 6,914,243 B2 | 7/2005 | Sheehan et al. | |
| 6,972,412 B2 | 12/2005 | Scholtz et al. | |
| 7,009,187 B2 * | 3/2006 | Gerlach et al. | 250/397 |

(Continued)

FOREIGN PATENT DOCUMENTS

JP    05174768    7/1993

(Continued)

OTHER PUBLICATIONS

Mathieu, C., 'The Beam-Gas and Signal-Gas Interactions in the Variable Pressure Scanning Electron Microscope', Scanning Microscopy, 1999, pp. 23-41 vol. 13, No. 1.

(Continued)

*Primary Examiner*—Bernard E Souw
(74) *Attorney, Agent, or Firm*—Scheinberg & Griner LLP; Michael O Scheinberg; David Griner (57) ABSTRACT

A novel detector for a charged particle beam system which includes multiple gas amplification stages. The stages are typically defined by conductors to which voltage are applied relative to the sample or to a previous stage. By creating cascades of secondary electrons in multiple stages, the gain can be increased without causing dielectric breakdown of the gas.

36 Claims, 10 Drawing Sheets

U.S. PATENT DOCUMENTS

| | | | |
|---|---|---|---|
| 7,060,976 | B2 | 6/2006 | Sheehan et al. |
| 7,462,839 | B2 | 12/2008 | Gnauck et al. |
| 7,541,580 | B2 * | 6/2009 | Knowles et al. ............. 250/310 |
| 2004/0262531 | A1 * | 12/2004 | Gerlach et al. ............. 250/397 |
| 2008/0035843 | A1 | 2/2008 | Hatano et al. |
| 2010/0108881 | A1 * | 5/2010 | Toth et al. ................. 250/307 |

FOREIGN PATENT DOCUMENTS

| | | |
|---|---|---|
| JP | 2003346697 | 5/2003 |
| WO | 9930344 | 6/1999 |
| WO | WO2004/059691 A1 | 6/2004 |
| WO | 2007143737 | 12/2007 |
| WO | 2008098084 | 8/2008 |

OTHER PUBLICATIONS

Toth, M., et al., "On the role of electron-ion recombination in low vacuum scanning electron microscopy," Journal of Microscopy, Jan. 2002, pp. 86-95, vol. 205 Pt. 1.

M. R. Phillips and S. W. Morgan, "Enhanced High Speed SE Imaging in a VPSEM Using a Frisch Grid," Microscopy Society of America, Microsc Microanal 12 (Supp. 2), 2006 pp. 1480-1481.

Witold Slowko, "Secondary Electron Detector with a Micro-Porous Plate for Environmental SEM," Vacuum 63, 2001, pp. 457-461.

Witold Slowko and Herbert Prasol, "Micro-sphere plate as an electron detector at low vacuum," Vacuum 67, 2002, pp. 191-198.

M. Jacka, M. Zadrazil, and F. Lopour, "A Differentially Pumped Secondary Electron Detector for Low-Vacuum Scanning Electron Microscopy," Scanning vol. 25, 2002, pp. 243-246.

Folch, Albert, et al., 'High-Vacuum versus "environmental" electron beam deposition,' J. Vac. Sci. Technol. B, Jul./Aug. 1995, pp. 2609-2614, vol. 14, No. 4.

Jacka, M., et al, 'A Differentially Pumped Secondary Electron Detector for Low-Vacuum Scanning Electron Microscopy,' Scanning, 2003, pp. 243-246, vol. 25.

Slowko, Witold, 'Secondary electron detector with a micro-porous plate for environmental SEM,' Vacuum, 2001, pp. 457-461, vol. 63.

Slowko, Witold, et al., 'Micro-sphere plate as an electron detector at low vacuum,' Vacuum, 2002, pp. 191-198, vol. 67.

* cited by examiner

MULTISTAGE GAS CASCADE AMPLIFIER

TECHNICAL FIELD OF THE INVENTION

The present invention relates to cascade detectors for charged particle beam systems.

BACKGROUND OF THE INVENTION

A scanning electron microscope (SEM) scans a primary beam of electrons along a sample surface and detects the secondary electrons that are emitted. An image is formed, with the intensity at each image point being proportional to the number of secondary electrons detected at the corresponding point on the sample. Most electron microscopes operate in a high vacuum to prevent scattering of the primary electron beam. Such electron microscopes typically use a secondary electron detector called an Everhard-Thornley detector, which includes a scintillator that emits light when struck by a secondary electron and a photomultiplier tube that amplifies the light to produce an electrical output signal. A photo multiplier tube typically has a gain of about $10^6$ that is, for each electron that enters the detector, about one million electrons are generated for detection. Such SEMs cannot observe moist samples, such as biological tissue, because the evaporating moisture scatters the primary beam and the vacuum dries the sample.

Figure 1:
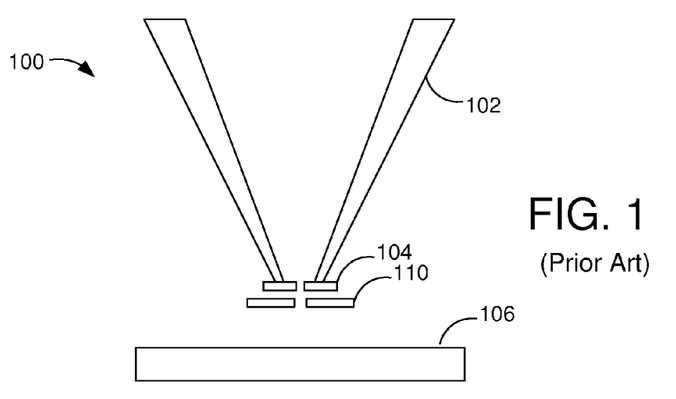
FIG. 1 shows a prior art HPSEM with a one-stage HPSEM detector.

One type of SEM, referred to as "High Pressure Scanning Electron Microscopes" (HPSEM), such as the ESEM® Electron Microscopes from FEI Company, the assignee of the present invention, has been developed for observing moist samples at relatively high pressure. HPSEMs are also useful for observing non-conductive samples, because ionized gas molecules serve to neutralize the sample. FIG. 1 shows an HPSEM 100 similar to the one described in U.S. Pat. No. 4,785,182 to Mancuso, et al. HPSEM 100 includes an objective lens 102 to which is attached a pressure limiting aperture 104 that allows electrons to move from the upper column to a sample 106, but restricts the flow of gas into the evacuated electron column. The pressure limiting aperture 104 allows the pressure in the sample chamber to be significantly higher than the pressure in the electron beam column above aperture 104, so that electrons are not scattered by gas molecules along most of their path.

A positive voltage relative to sample 106 is applied to a detector 110, which consists of an electrode that is concentric with the optical axis. Secondary particles emitted from the sample 106 are accelerated toward the detector 110 and collide with gas molecules, producing additional charged particles, which in turn collide with other gas molecules to produce even more charged particles. Such a process is called a "cascade." The ultimate number of charged particles produced in this manner is proportional to the number of secondary particles emitted at the substrate, thereby producing an amplified signal corresponding to the number of secondary particles. The electron source and much of the path of the primary beam is maintained in a high vacuum by the aperture 104 that passes the primary beam but prevents most gas molecules from entering the column. Gas pressure at the sample in an HPSEM is typically maintained at around 0.1 to 50 Torr, and more typically between 0.5 and 5 Torr.

The amplification of the secondary electron signal in an HPSEM depends on the gas pressure, the electron path length, and the voltage between the sample and the detector. The amplification is typically much lower that that of an ET detector. Higher gas pressure allows for more collision and may better preserve some types of samples, such as hydrated biomaterials, but too high a pressure impedes the gas cascade and reduces the amplified imaging signal. A longer path length generally results in more collisions. Magnetic and electric fields can be used to increase the path length of the secondary electrons to provide greater amplification. For example, U.S. Pat. No. 6,972,412 for "Particle-Optical Device and Detection Means" to Scholtz et al., assigned to the assignee of the present invention, describes using magnetic and electric fields between the detector and the specimen holder to lengthen the path of the secondary electrons to produce increased amplification. Increasing the voltage between the sample and the detector provides more energy to the electrons to ionize gas molecules. Too high a voltage, however, causes dielectric breakdown of the gas, that is, a self-sustaining gas ionization cascade. The signal is then no longer proportional to the secondary electron current produced by the primary beam and is no longer useful for forming an image of the sample.

Many detectors for HPSEM's use a circular electrode that is concentric with the optical axis as shown in FIG. 1. Some systems use an off-axis detector. For example, U.S. Pat. No. 7,193,122 of Jacka, et al. uses an off axis detector chamber that is maintained at a lower pressure than the sample chamber. A grid positioned in front of the detector entrance attracts electrons, which pass through a pressure limiting grid to enter a differentially pumped chamber. Because the chamber interior is maintained at a lower pressure than the sample chamber, the high voltage required by a scintillator detector does not cause breakdown of the gas.

M. R. Phillips and S. W. Morgan, in "Enhanced High Speed SE Imaging in a VPSEM Using a Frisch Grid," *Micros Microanal* 12 (Supp 2) 2006 describe the use of a Frisch grid near the anode of a detector to shield the anode from current induced by ion movement beyond the grid, so that the anode signal primarily reflects the electron motion, which is faster and therefore increases the detector bandwidth. While Phillips et al. increase the detector bandwidth, they do not address the detector gain or noise.

Thus, the amplification of the secondary electron signal in an HPSEM is limited by a number of factors. It would be desirable to increase the amplification to improve the sensitivity of the microscope.

SUMMARY OF THE INVENTION

An object of the invention is to improve secondary electron signal amplification in an HPSEM This invention provides for a detector for a HPSEM that includes multiple gas cascade amplification stages. The stages are typically defined by electrodes to which voltages are applied relative to the sample or to a previous stage. By creating gas ionization cascades in multiple stages, and by confining some gaseous ions to the stages in which they are generated, two benefits are realized. First, the maximum detector gain can be increased without causing dielectric breakdown of the gas. Second, amplification noise can be reduced.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more through understanding of the present invention, and advantages thereof, reference is now made to the following descriptions taken in conjunction with the accompanying drawings, in which.

DETAILED DESCRIPTION OF PREFERRED EMBODIMENTS

The present invention greatly increases the maximum gain and reduces noise in a cascade detector, that is, a detector using gas amplification. The maximum gain in a cascade detector is limited in many prior art systems by dielectric breakdown of the gas. The dominant breakdown mechanism is believed to be feedback in the gas cascade caused by electron injection into the cascade as a result of ion recombination or neutralization at the sample and surfaces, such as the lens pole piece, inside the specimen chamber. The ion neutralization generates additional electrons, referred to here as "tertiary electrons", which then accelerate toward the anode, generating additional electrons and ions which in turn generate additional electrons upon neutralization. The unwanted feedback generates an electron signal that eventually becomes self-sustaining and swamps the useful imaging signal from the sample. In addition, the feedback component of the gas cascade amplification process serves to increase noise due to the statistical nature of the tertiary electron generation process.

Embodiments of the invention provide multiple amplification regions, each region amplifying the electron signal from the previous region, with the anode positioned toward the end of the final amplification region. The amplification regions comprise a detector volume, which, typically extends from the sample surface to the anode. The electrical potential increases from one amplification region to the next in the direction of the anode. As gaseous ions are created, they are neutralized in the region in which they are created, or in a previous, lower potential region, that is, a region closer to the sample. By providing a recombination location that is nearer than the sample to the anode (i.e., at a higher potential than that at the sample surface), electrons generated by the neutralization traverse a smaller potential difference than those generated at the sample. The smaller the potential difference traversed by an electron traveling to the anode, the smaller the extent to which it is amplified in the gas cascade. Therefore, reducing the potential difference experienced by electrons generated by recombination serves to suppress feedback and allows for a higher overall gain of the system prior to the onset of breakdown. In addition, feedback suppression serves to reduce noise associated with the feedback process.

The potential field in the amplification regions can be produced and shaped by electrodes, such as grids, porous members or other types of electrodes. For example, some embodiments of the invention provide one or more electrodes positioned between the anode and the sample, to provide surfaces for ions generated in the gas to neutralize, that is, to recombine with electrons. The electrodes are preferably semitransparent to electrons accelerated toward the electrode from the sample or the previous amplification stage. The electrode may also be semi-transparent to gaseous ions that drift back toward the previous stage or sample.

The invention is not limited to a specific type of imaging signal. The imaging signal can be derived, for example, from an electrical signal induced in an electrode, such as the anode or another electrode, by charge flow in the gas. The imaging signal can also be derived from an electron current collected by the anode, an ion current collected by a cathode, or a luminescence signal generated by the gas cascade.

As described above, embodiments of the invention use multiple gas amplification stages to increase the maximum gain attainable before the onset of dielectric breakdown of the gas. The modeling results described below show that, in the absence of other gas breakdown mechanisms and ion-induced space charge effects, the maximum gain can be made to increase with the number of amplification stages. In practice, effects such as ion-induced space charges may limit ultimate gain.

Through the use of multiple gas amplification stages, the present invention can control the feedback in the gas cascade to provide gas gains greater than those attainable by existing cascade detectors. Benefits of multi-stage amplification are believed to stem from the ability to control the fraction of ions that recombine in each stage, which is thought to affect the breakdown of the gas. Controlling the fraction of ions that recombine in each stage provides at least two benefits. First, breakdown gain can be increased by increasing the number of gas amplification stages. Second, cascade noise can be controlled by minimizing feedback within each stage whilst maintaining a given total system gain.

Detectors in accordance with the invention having multiple stages can be configured to simultaneously optimize multiple factors. For example, the first stage can be designed to optimize secondary electron extraction efficiency and charge control, by controlling the electric field in the first stage and by controlling the ion flux at the sample surface. The last stage can then be designed to optimize detector bandwidth by optimizing the distance between the anode and the final grid and the electrostatic transparency of the final grid. The total number of stages and the extent of amplification within each stage can be designed to optimized net system gain and net system noise.

Figure 2:
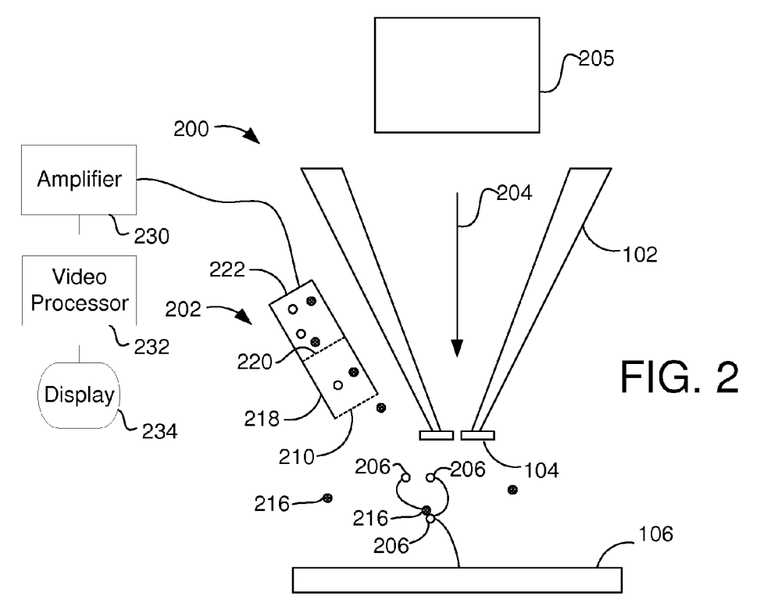
FIG. 2 shows an HPSEM with a three-stage detector embodiment of the invention.

FIG. 2 shows an HPSEM 200 including a preferred three stage detector 202 embodying the present invention. In the system of FIG. 2, a beam of primary electrons 204 from a source of electrons, such as an electron column 205, impacts the sample 106, which is positioned in a sample chamber containing a gaseous atmosphere, for example, of water vapor at a pressure of between 1 Torr (1.3 mbar) and 5 Torr (6.7 mbar). Secondary electrons 206 are emitted from the sample 106 and accelerate toward first conductive grid 210, which is biased positive relative to sample 106. Secondary electrons 206 collide with gas molecules 216, ionizing them and creating additional electron that accelerate toward first conductive grid 210 near the entrance of a detector chamber 218. The ionized gas molecules accelerate toward the sample, moving much slower than the electrons.

A second conductive grid 220, biased positively with respect to the first conductive grid, accelerates the electrons 206 transmitted through the first conductive grid 210. While moving from first conductive grid 210 to second conductive grid 220, electrons 206 collide with additional gas molecules 216 and further amplify the secondary electron signal. An anode 222 mounted toward the rear of detector chamber 218 and biased positive relative to the second conductive grid 220 collects the electrons 206 and is used to detect an electric current, which is amplified by an amplifier 230 and processed by a video processor 232 together with position information about the primary electron beam, to produce an image of the sample 106, which is displayed on display 234. In one preferred embodiment, for example, the sample is maintained at a potential of about 0 volts, first conductive grid 210 is maintained at a potential of about 100 V, second conductive grid 220 is maintained at a potential of about 300 V, and anode 22 is maintained at a potential of about 600 V. First conductive grid 210 is preferably positioned about 10 mm from sample 106; second conductive grid 220 is preferably spaced about 10 mm from first conductive grid 210; and anode 222 is preferably spaced about 10 mm from second conductive grid 220. These values are provided as an example and a guide, and skilled persons can readily determine process parameters for specific implementations. To reduce the creation of tertiary electrons and thereby reduce the tendency for dielectric breakdown, one or more of the conductive grids in any of the embodiments may be coated with a material, such as amorphous carbon, that exhibits reduced secondary electron emission when impacted by charged particles.

By providing multiple stages, the voltage between different points in the system can remain below a threshold that would cause dielectric breakdown of the gas within any given stage, while still providing increased overall system gain. Conductive grid 220 provides a surface at which ions produced between grid 220 and anode 222 can neutralize by recombining with an electron from the grid. If the recombination produces additional electrons, such as Auger electrons or photoelectrons, those electrons travel only from grid 220 to anode 222. If there were no opportunity for the ions to recombine with electrons before reaching sample 106, the tertiary electrons created by the recombination would travel across a much greater potential difference and would be amplified much more in the gas cascade. Amplification of these tertiary electrons serves to increase feedback which eventually causes breakdown of the gas (i.e., a self-sustaining gas cascade that overwhelms the useful signal from the sample).

Similarly, conductive grid 210 provides a surface at which ions produced between grid 210 and anode 222 can neutralize by recombining with an electron from the grid 210.

The system of FIG. 2 comprises three amplification stages. Stage 1 is created by the sample 106 and conductive grid 210, stage 2 is created by conductive grid 210 and conductive grid 220, and stage 3 is created by conductive grid 220 and anode 222.

Figure 3:
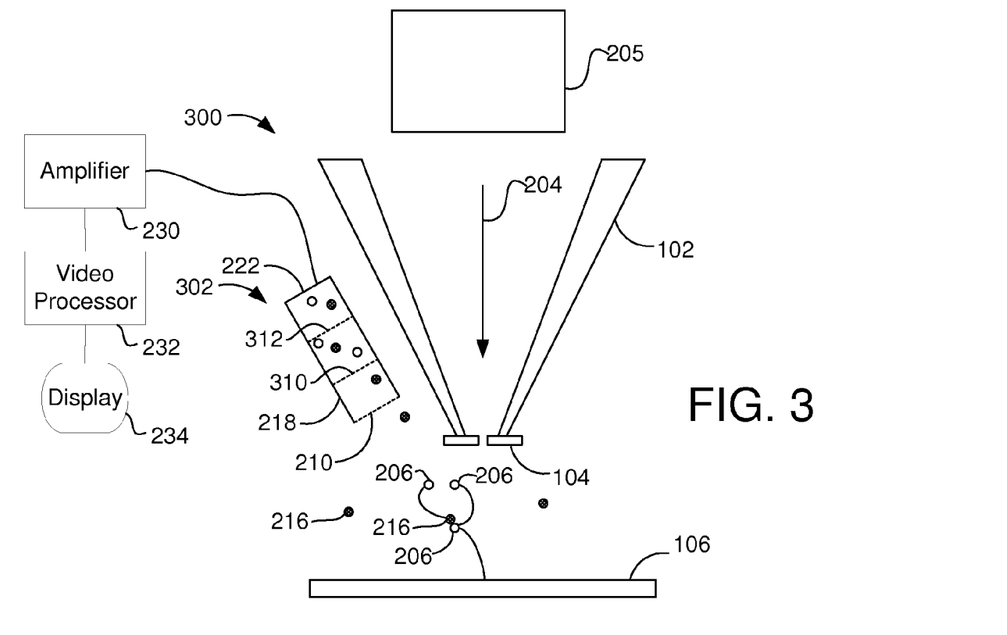
FIG. 3 shows an HPSEM with a four-stage detector embodiment of the invention.

FIG. 3 shows another embodiment of an HPSEM 300, similar to that of FIG. 2, but having a detector 302 including four stages created by conductive grids 210, 310 and 312 and the anode 322. Additional stages provide additional amplification prior to the onset of breakdown. Operating parameters are similar to those of the embodiment of FIG. 2, and skilled persons can readily determine appropriate operating parameters for the embodiment of FIG. 3 from information provided herein with regard to other embodiments.

Figure 4:
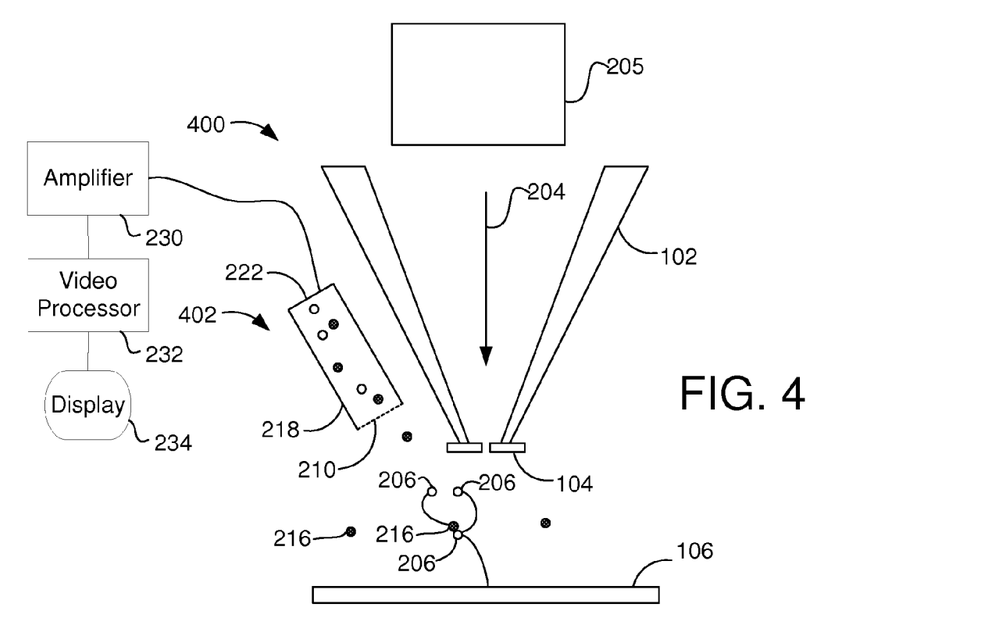
FIG. 4 shows an HPSEM with a two-stage detector embodiment of the invention.
Figure 5:
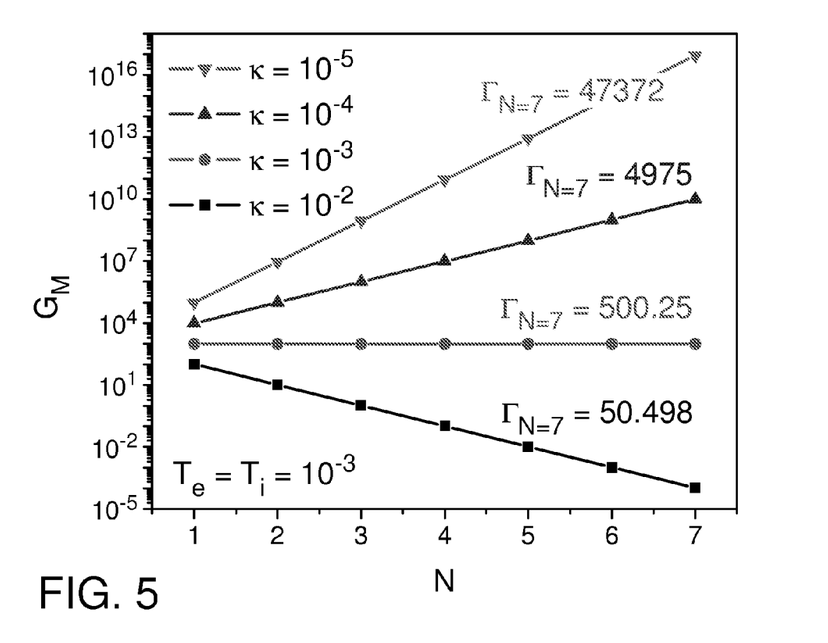
FIGS. 5-8 are graphs showing the breakdown gain as a function of the total number of stages, calculated for different values of the electron ejection probabilities and grid transmittances.
Figure 6:
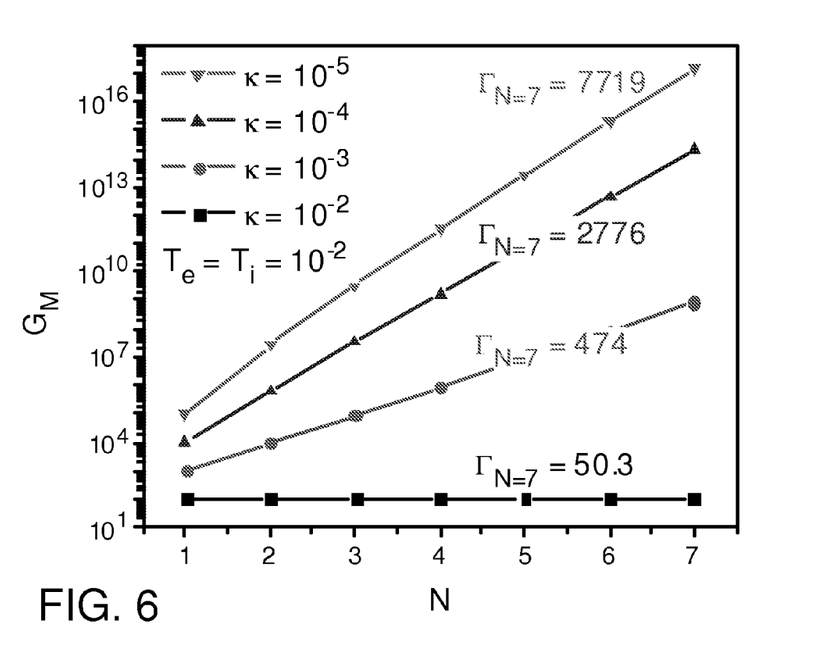
Figure 7:
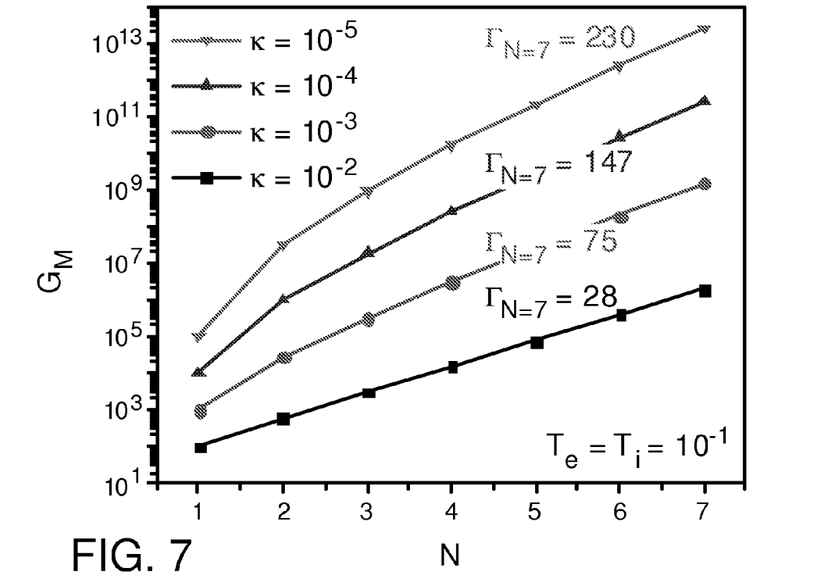
Figure 8:
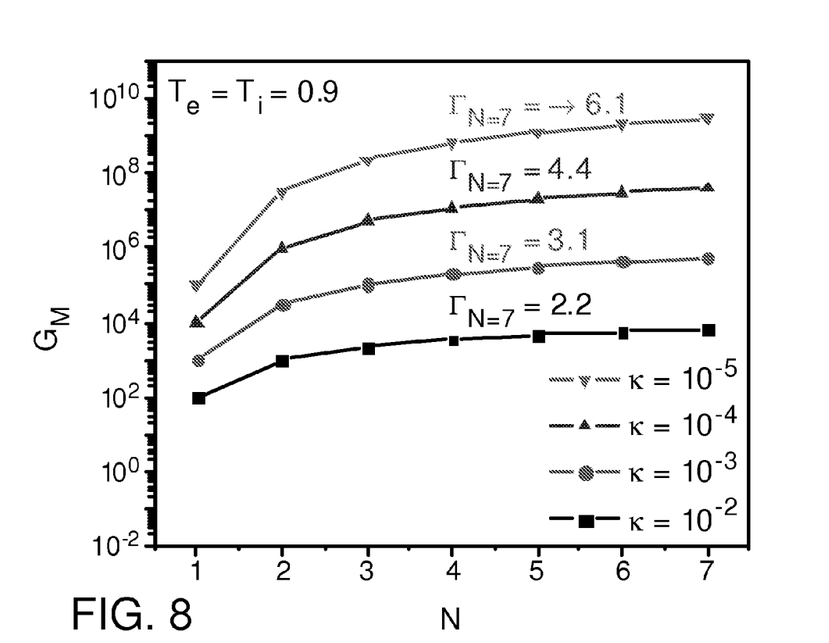
Figure 9:
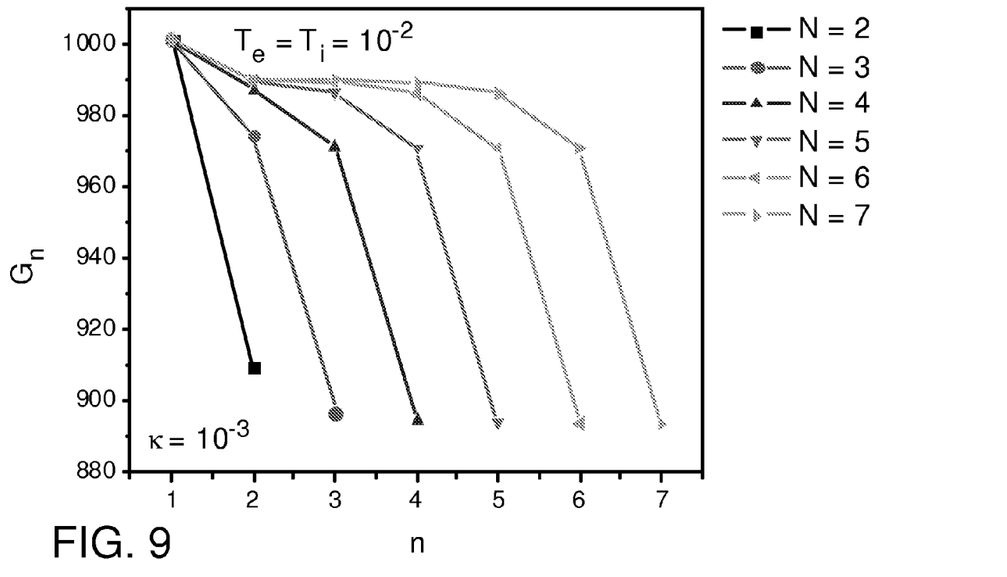
FIGS. 9-12 are graphs showing the gain in each stage as a function of stage number, calculated at the point of breakdown for different grid transmittances.
Figure 10:
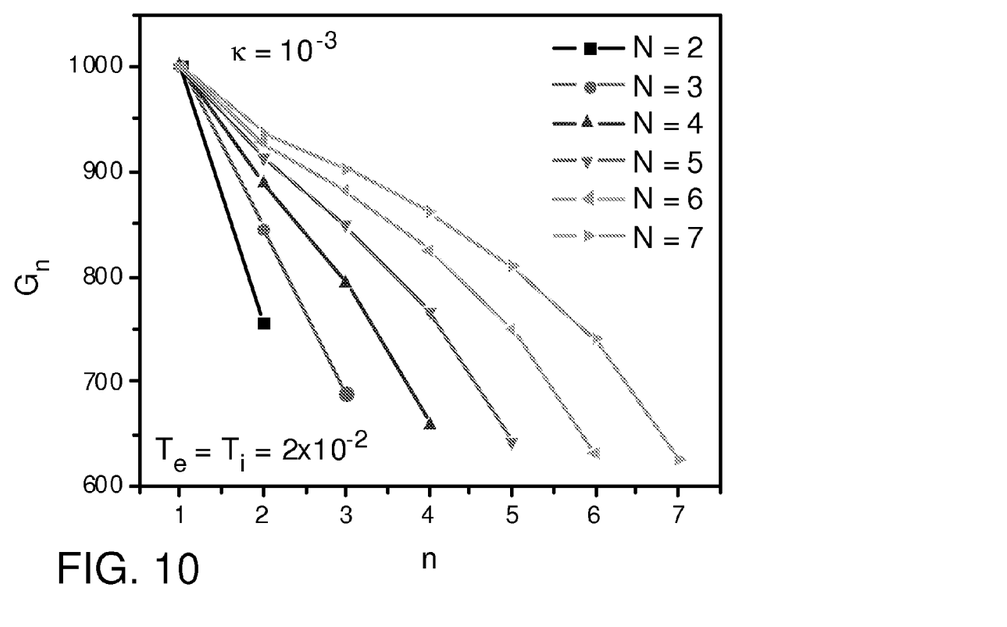
Figure 11:
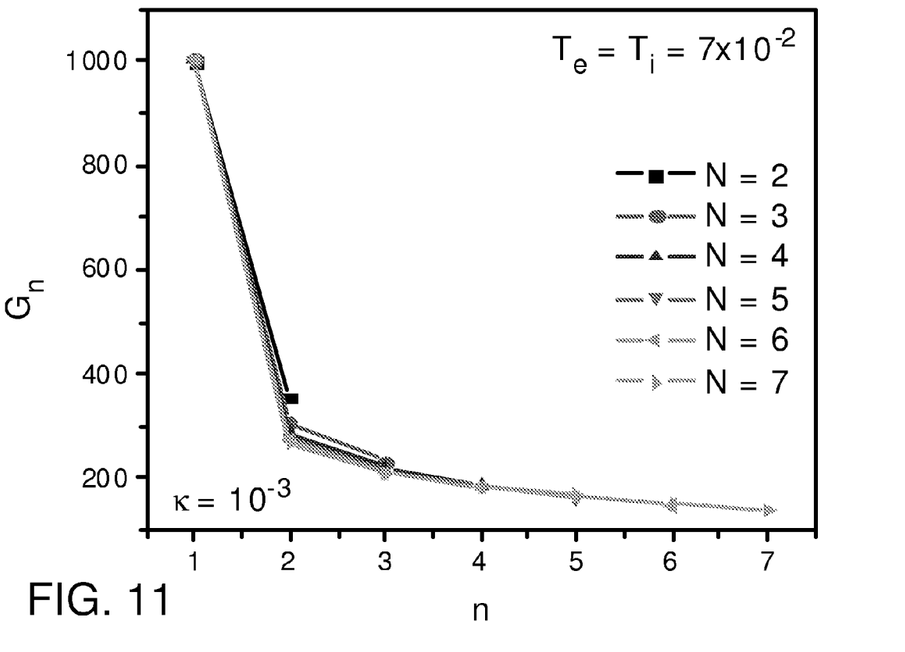
Figure 12:
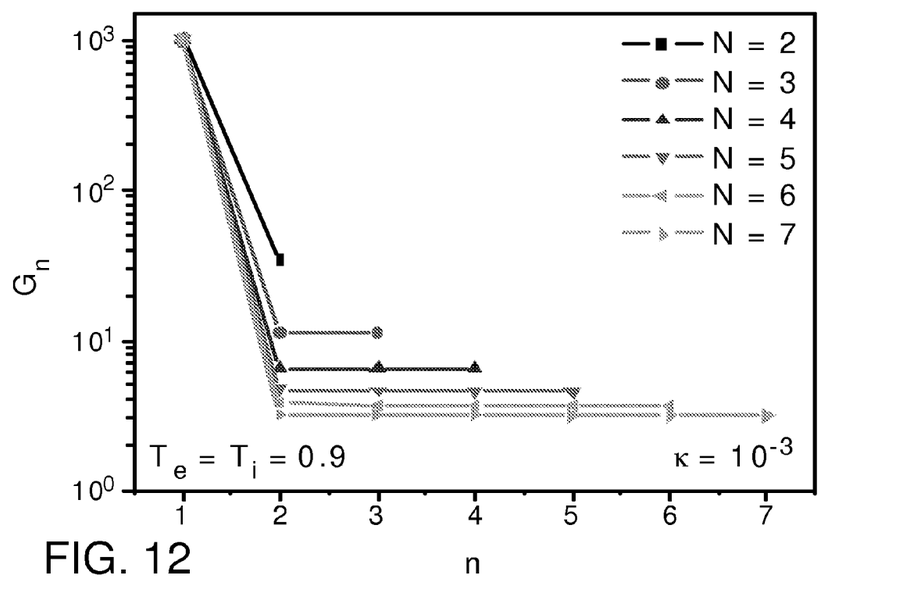

FIG. 4 shows another embodiment of an HPSEM 400 that include a two-stage detector 402 having a single conductive screen 210. While detector 402 includes only a single conductive screen, the electron path from the sample to the conductive screen 210 can be considered a first stage, while the electron path from conductive screen 210 to anode 222 can be considered a second stage. Sample 106 is preferably maintained at about 0 V, conductive screen 210 is preferably maintained at about 200 V, and anode 222 is preferably maintained at about 500 V. Conductive screen 210 is preferably positioned about 10 mm from sample 106, and anode 222 is preferably spaced about 10 mm from conductive screen 210. In some preferred embodiments, the gain of the second stage is at least ½ the gain of the first stage, and more preferably at least the same as or twice the gain of the first stage.

While the embodiment of FIG. 4 superficially appears to be similar to the system described by Phillips et al., Phillips teaches that the conductive grid is positioned very near the anode so that very few ions are created between his grid and the anode. In the embodiment of FIG. 4, conductive screen 210 is positioned sufficiently far from the anode 222 so that additional ions are created to further amplify the signal. In fact, the results shown in FIGS. 5-20 and discussed below show that optimal performance is realized when two criteria are satisfied. First, the gain and hence the ion generation rate between the grid and the anode must be greater than the ion generation rate between the sample and the grid. Second, the grid must collect as many of the ions generated in the gas cascade as possible. However, the grids in both the system described here and in the system described by Phillips can only collect ions generated between the grid and the anode. Hence, Phillips' recommendation to minimize ion generation between the grid and the anode serves to minimize the benefits of multi-stage amplification. The extreme case of no ion generation between the grid and the anode represents an optimal condition according to Phillips, but eliminates the benefits of multi stage amplification entirely.

The analyses below show that various embodiments of the invention can significantly increase gain. Below is an analysis of the gas cascade feedback for a one stage system, a two stage system, and a three stage system, and a general model describing the gain of an N-stage system, where N is any non-zero positive integer.

One Stage System

Amplification by a 1 stage gas cascade amplifier is described by:

$$J_1 = \Gamma[J_0 + (J_1 - J_0)\kappa] = \frac{\Gamma J_0(1-\kappa)}{1-\Gamma\kappa} \quad (1)$$

where:
- $J_0$=input electron current (imaging signal)
- $J_1$=output electron current (amplified imaging signal)
- $\Gamma$=gas gain in the absence of feedback (given by the anode bias, gas pressure ...)
- $J_1-J_0$=ion generation rate
- $\kappa$=feedback coefficient=probability that a neutralizing ion will inject an electron into the gas cascade ($\kappa$ is determined by the electronic structure of the surface at which the ion neutralizes, and the ion species and energy)

The net gain (G) and "feedback" (F) of the gas amplifier are given by:

$$G = J_1/J_0 \quad (2)$$

$$F = \frac{(J_1-J_0)\kappa}{J_0} \quad (3)$$

Physically, F is the mean number of electrons generated by neutralizing ions, per electron injected into the gas cascade via the input electron current $J_0$.

The maximum useful gain (GM), referred to from hereon as "breakdown gain" is limited by gas breakdown which occurs when F reaches unity, at which point Equation 3 can be rearranged to yield:

$$J_{1,breakdown} = \frac{J_0(\kappa+1)}{\kappa} \quad (4)$$

which can then be inserted into Equation 1 to yield an expression for $\Gamma$ (gain in the absence of feedback) at the point of breakdown:

$$\Gamma_{breakdown} = \frac{J_0(1+\kappa)}{\kappa(J_0 - J_0\kappa + J_1\kappa)} \quad (5)$$

which, in the case of unit input current (i.e., whereby $J_0=1$) simplifies to:

$$\Gamma_{breakdown} = \frac{1+\kappa}{2\kappa} \quad (6)$$

That is, the in the case of a single stage system, breakdown occurs when $\Gamma = 0.5\kappa^{-1} + 0.5$.

Two Stage System

Amplification by a 2 stage gas cascade amplifier can be described by:

$$J_1 = \Gamma_1[J_0 + (J_1-J_0)\kappa_1 + (J_2-T_{e1}J_1)T_{i1}\kappa_1] \quad (7)$$

$$J_2 = \Gamma_2[T_{e1}J_1 + (J_2-T_{e1}J_1)(1-T_{i1})\kappa_2] \quad (8)$$

where:
- $J_0$=stage 1 input electron current
- $J_{n>0}$=stage n output electron current
- $\Gamma_n$=stage n gas gain in the absence of feedback
- $\kappa_n$=feedback coefficient of stage n (i.e., the probability that an ion neutralizing in stage n will inject an electron into stage n)
- $T_{en}$=electron transmittance of grid n
- $T_{in}$=ion transmittance of grid n
- $J_1-J_0$=ion generation rate in stage 1
- $(J_2-T_{e1}J_1)$=ion generation rate in stage 2
- $(J_2-T_{e1}J_1)T_{i1}\kappa_1$=electron current injected into stage 1 due to neutralization in stage 1 of ions that were generated in stage 2
- $T_{i1}\kappa_1$=probability that an ion generated in stage 2 will be transmitted through grid 1 (i.e., neutralize in stage 1) and will eject an electron into stage 1
- $(1-T_{i1})$=fraction of ions generated in stage 2 that recombine on grid 1
- $(1-T_{i1})\kappa_2$=fraction of ions generated in stage 2 that recombine on grid 1 & inject electrons into stage 2

The net gain ($G_n$) and "feedback" ($F_n$) of stage n are given by:

$$G_1 = J_1/J_0 \quad (9)$$

$$G_2 = \frac{J_2}{T_{e1}J_1} \quad (10)$$

$$F_1 = \frac{(J_1-J_0)\kappa_1}{J_0} \quad (11)$$

$$F_2 = \frac{(J_2-T_{e1}J_1)(1-T_{i1})\kappa_2}{T_{e1}J_1} \quad (12)$$

The net gain (G) of the 2 stage amplifier is given by:

$$G = J_2/J_0 \quad (13)$$

The "net feedback" of a multi stage amplifier is not a meaningful concept because a distinct feedback loop is created in each stage. The only parameters of relevance are the feedback coefficient ($\kappa_n$) and "feedback" ($F_n$) of each stage n. Gas breakdown occurs when any one of the $F_n$ values reaches unity. The sum $\Sigma F_n$ can exceed unity.

Each stage "m" also feeds back into each previous stage "n" (whereby n<m) due to ion transmission through the grids. This effect is accounted for by the above equations.

Three Stage System

Amplification by a 3 stage gas cascade amplifier can be described by:

$$J_1 = \Gamma_1[J_0 + (J_1-J_0)\kappa_1 + (J_2-T_{e1}J_1)T_{i1}\kappa_1 + (J_3-T_{e2}J_2)T_{i2}T_{i1}\kappa_1] \quad (14)$$

$$J_2 = \Gamma_2[T_{e1}J_1 + (J_2-T_{e1}J_1)(1-T_{i1})\kappa_2 + (J_3-T_{e2}J_2)T_{i2}(1-T_{i1})\kappa_2] \quad (15)$$

$$J_3 = \Gamma_3[T_{e2}J_2 + (J_3-T_{e2}J_2)(1-T_{i2})\kappa_3] \quad (16)$$

where:
- $J_0$=stage 1 input electron current
- $T_{en}J_n$=stage (n+1) input electron current (n>1)
- $J_n>0$=stage n output electron current
- $J_1-J_0$=ion generation rate in stage 1
- $J_n-T_{e(n-1)}J_{(n-1)}$=ion generation rate in stage n $T_{in}\kappa_n$=probability that an ion generated in stage (n+1) will be transmitted through grid n (i.e., neutralize in stage n) and will eject an electron into stage n $1-T_{in}$=fraction of ions generated in stage (n+1) that recombine on grid n $[1-T_{i(n-1)}]\kappa_n$=fraction of ions generated in stage n that recombine on grid (n-1) & inject electrons into stage n The net gain ($G_n$) and "feedback" ($F_n$) of stage n are given by:

$$G_1 = J_1/J_0 \tag{17}$$

$$G_n = \frac{J_n}{T_{e(n-1)}J_{(n-1)}}, \quad (n > 1) \tag{18}$$

$$F_1 = \frac{(J_1 - J_0)\kappa_1}{J_0} \tag{19}$$

$$F_n = \frac{(J_n - T_{e(n-1)}J_{(n-1)})(1 - T_{i(n-1)})\kappa_n}{T_{e(n-1)}J_{(n-1)}}, \quad (n > 1) \tag{20}$$

The net gain (G) of the 3 stage amplifier is given by:

$$G = J_3/J_0 \tag{21}$$

N Stage System

Amplification by an N stage gas cascade amplifier can be described by:

$$J_n = \Gamma_n \left[ \begin{array}{c} T_{e(n-1)}J_{(n-1)} + \\ \sum_{m=n}^{N} \{(J_m - T_{e(m-1)}J_{(m-1)})M\}(1 - T_{i(n-1)})\kappa_n \end{array} \right] \tag{22}$$

where:

$M = \prod_{k=n}^{m-1} T_{ik}$, if $\{m > n\}$, or $M = 1$ (otherwise)

$n = 1, 2, 3 \ldots N$ $T_{e0} = 1$ $J_{(n>N)} = 0$ $T_{i0} = 0$

For each stage n, $T_{e(n-1)}J_{(n-1)}$ is the input electron current from the previous stage (or the sample). The sum over m is the ion current in each stage. The product of sums M accounts for the transmittance of the grids that each ion current component has to travel through to reach stage n, and $[1-T_{i(n-1)}]$ is the fraction of ions that recombine in stage n.

The net gain (G) of an N stage amplifier is given by:

$$G = J_N/J_0 \tag{23}$$

Equation 22 can be used to write out the individual equations for $J_n$ of each stage n of an N stage system.

Gain & Feedback Analysis 1: Identical Amplification Stages

In this section, we assume that the parameters governing the behavior of each stage of a given system are the same: gas gain in the absence of feedback $\Gamma_n$, electron & ion transmittance of each grid, $T_{en}$ and $T_{in}$, and electron ejection probability of an ion $\kappa_n$.

FIGS. 5-8 show plots of $G_M$, the maximum gain before breakdown, calculated as a function of N using a range of electron ejection probabilities ($\kappa$) and grid transmittances ($T_e=T_i$). Also shown is the range of pre-feedback gains ($\Gamma_N$) required to cause gas breakdown in each system. $G_M$ increases with $\kappa^{-1}$ (always). In stage 1, $\kappa$ can not be well controlled since it is a function of the sample surface which must receive ions in order for charge control to work. In higher stages, it is a function of the grid material and so can be minimized (e.g., by carbon coating of the grids) to maximize $G_M$.

FIGS. 5-8 show that the magnitude of the grid transmittance ($T=T_e=T_i$) has a direct effect on how the addition of amplification stages affects net gain. If $T>\kappa$, an increase in N serves to increase $G_M$. If $T<\kappa$, an increase in N serves to reduce $G_M$ because electron collection by each grid exceeds the gain of each amplification stage. If $T=\kappa$, an increase in N has a negligible effect on $G_M$.

FIGS. 9-12 show the gain of each individual stage ($G_n$) plotted as a function of stage number (n) at the point of breakdown, using a number of values of N and T. The greatest gain (and gas breakdown) always occurs in stage 1 of each system and $G_n$ decreases with n because $\Gamma$ was fixed in each stage (of a given system) and the gain of each stage is contributed to by ions generated in all subsequent stages (m>n, see Equation 22). In other words, the smaller the value of T, the smaller the fraction of ions that drift into stage 1 from stages upstream of 1, and the greater the permissible gain in each of these stages prior to the onset of breakdown in stage 1.

Figure 13:
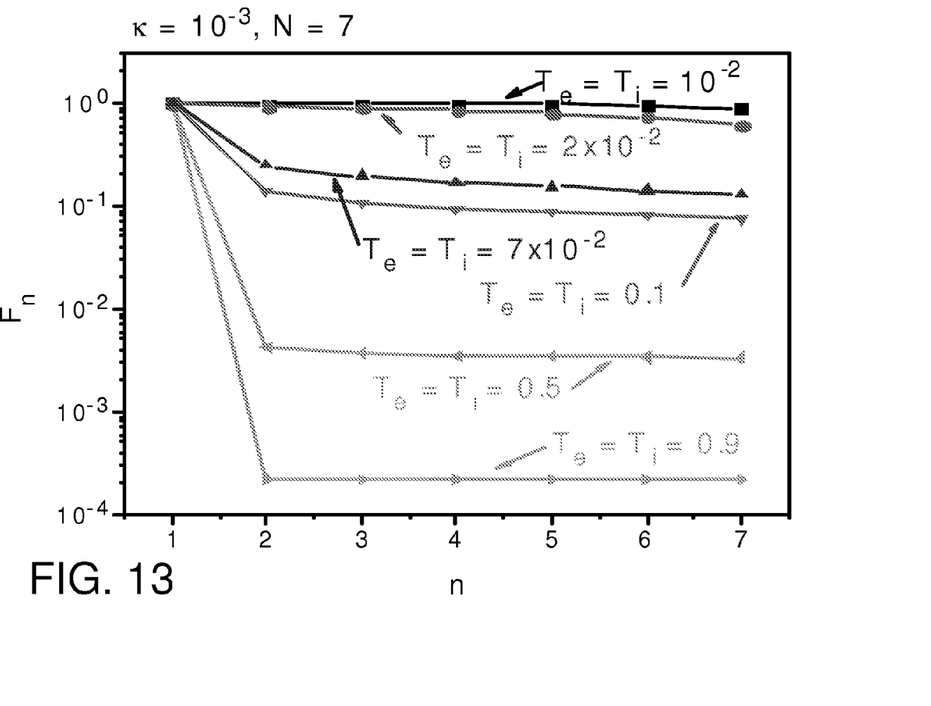
FIG. 13 is a graph showing feedback in each stage as a function of stage number.

FIG. 13 shows feedback in each stage as a function of stage number $F_n(n)$, calculated at the point of breakdown for the grid transmittances ($T_e$ & $T_i$) shown in the graph. FIG. 13 shows that, at the point of breakdown (characterized by $G_M$), an increase in grid transmittance ($T_e$ and $T_i$) causes a decrease in $F_{n>1}$. This can be understood as follows. In the present configuration (where the pre-feedback gains and transmittances of all grids are the same), $G_M$ is limited by breakdown (i.e., feedback) in the first amplification stage (i.e., breakdown occurs when $F_1=1$). An increase in $T_i$ causes an increase in the number of ions injected into stage 1 from stages other than stage 1, and hence a decrease in $F_{n>1}$.

Figure 14:
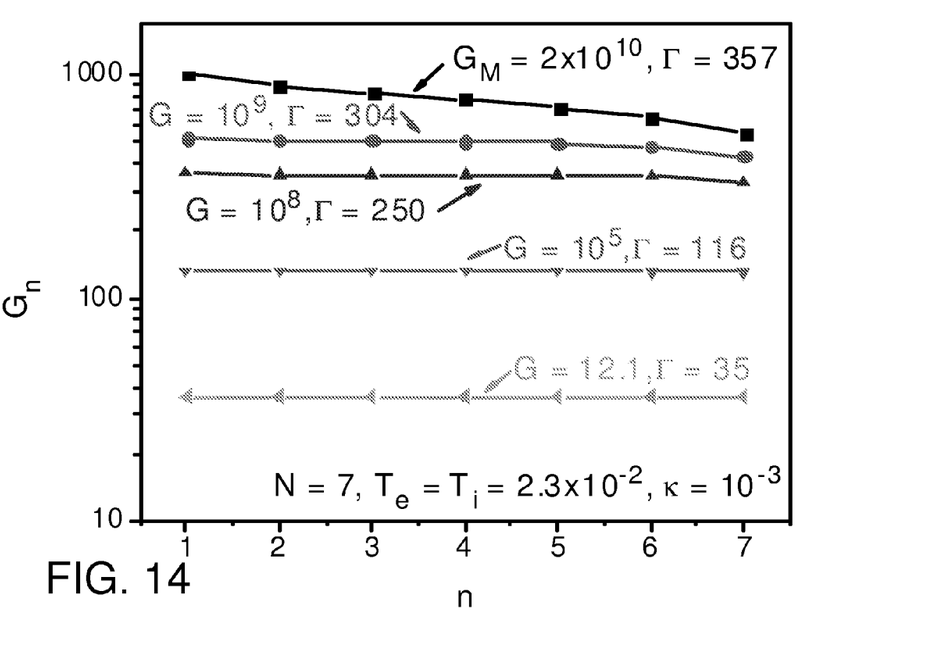
FIG. 14 is a graph showing the gain in each stage as a function of stage number at a number of pre-feedback and total system gains.

FIG. 14 shows the gain distribution ($G_n(n)$) calculated for a 7 stage system at a number of system gains (G), ranging from G=12.1 to G=$G_M$. The graph illustrates how a multistage system can be used to achieve gains greater than the breakdown gain of a 1 stage system ($G_{M, N=1}$=500.5, as per Equation 6), even when the gain of the multi-stage system is much lower than $G_M$ of the multi-stage system. This condition is favorable because the noise component contributed by feedback increases as G approaches $G_M$. Hence, multiple amplification stages can be used to simultaneously increase and decrease the gain and the noise of a one stage system, respectively.

Gain & Feedback Analysis 2: Non-Identical Amplification Stages

Figure 15:
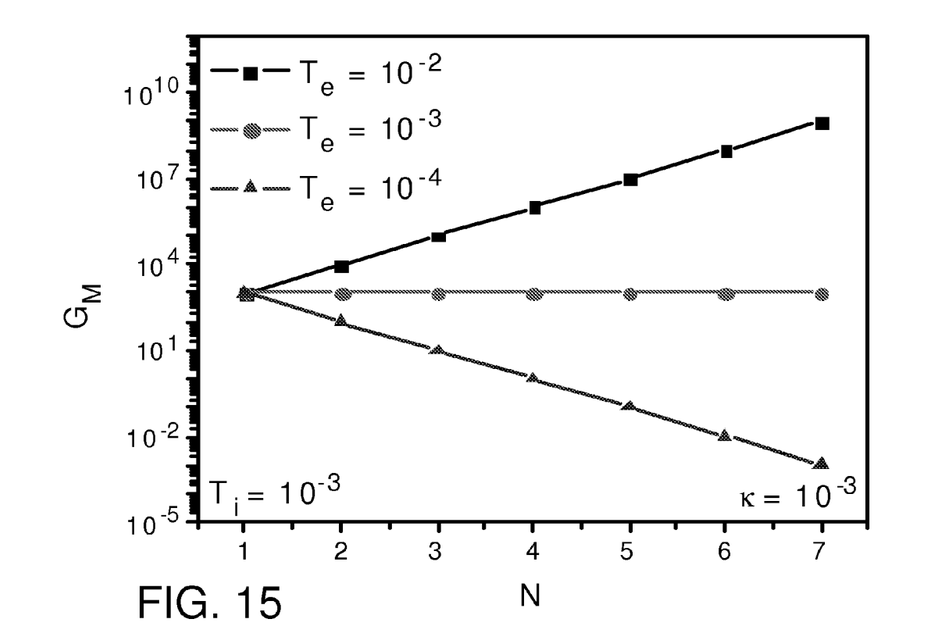
FIGS. 15-16 are graphs showing the breakdown gain as a function of the total number of stages, calculated for different values of the electron ejection probabilities and grid transmittances.
Figure 16:
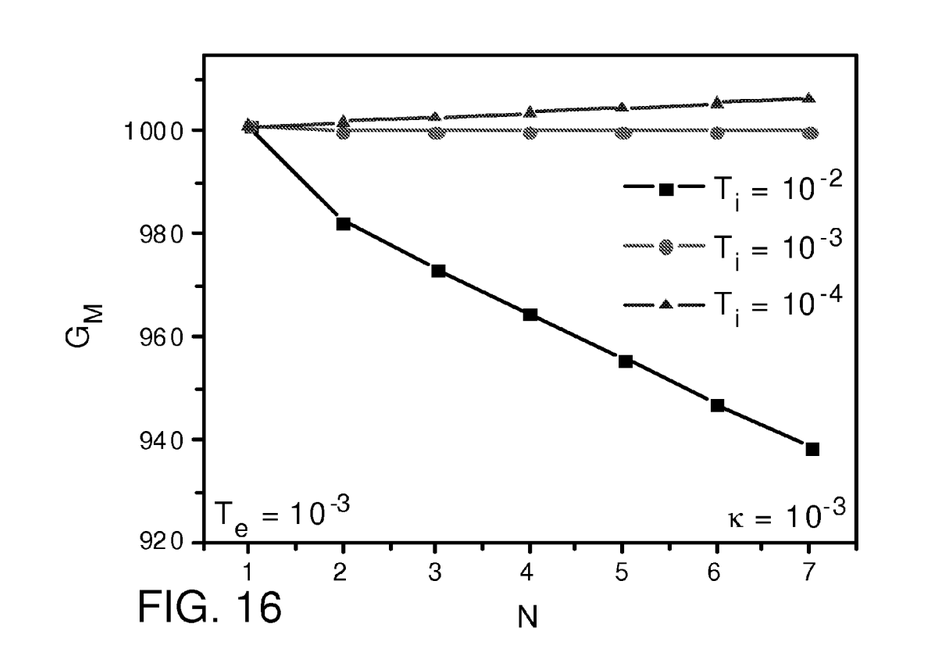

FIG. 15 shows that an increase in $T_e$ causes an increase in $G_M$ because it reduces the fraction of electrons collection by each grid. FIG. 16 shows that an increase in $T_i$ causes a decrease in $G_M$ since it increases the fraction of ions recombining in stage 1 that are generated in stages other than stage 1.

The results in FIG. 15 and FIG. 16 show that to optimize a multi-stage system, $T_e$ and $T_i$ must be simultaneously maximized and minimized, respectively. In practice, such an optimization is difficult to realize because an increase in $T_e$ is generally accompanied by an increase in $T_i$. These two parameters can, in principle, be decoupled using a magnetic field that can be used to steer electrons and towards different locations of a non-uniform grid. However, in HPSEM, such preferential steering is impeded by collisions between gas molecules and the charged particles.

Figure 17:
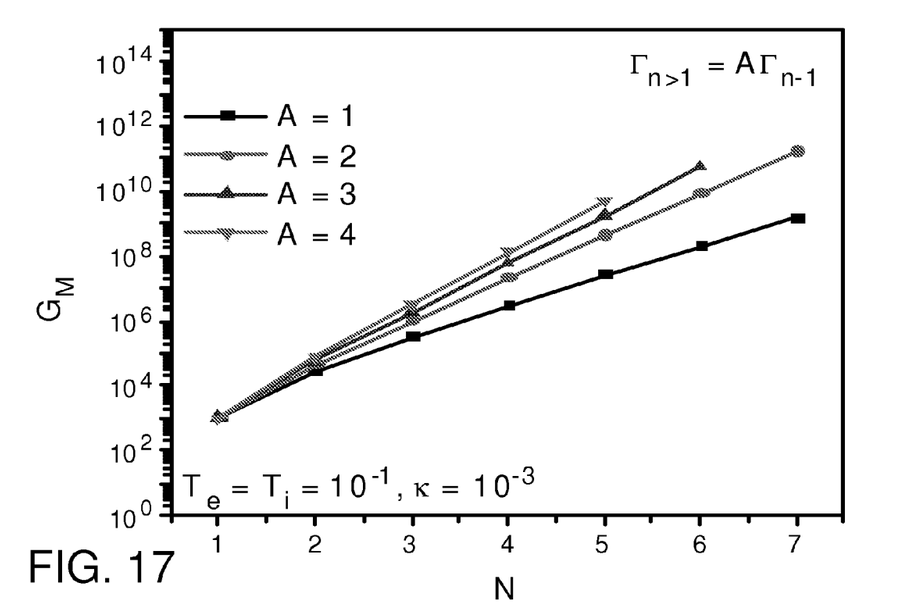
FIG. 17 is a graph showing the breakdown gain as a function of the total number of stages, calculated for a range of pre-feedback gain distributions.
Figure 18:
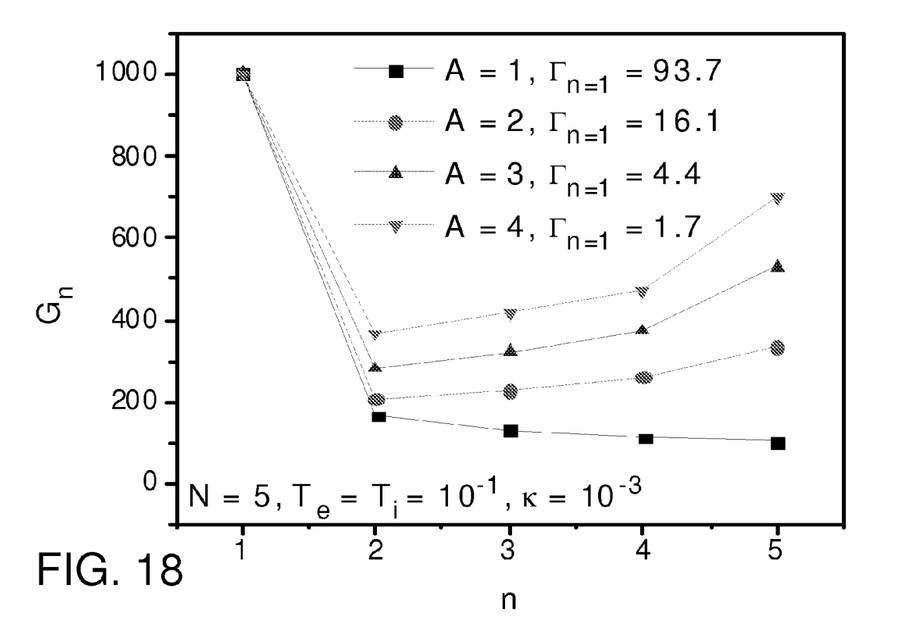
FIG. 18 is a graph showing the gain in each stage of a 5 stage system, calculated for a range of pre-feedback gain distributions.

FIG. 17 is a graph showing the breakdown gain ($G_M$) calculated as a function of the total number of amplification stages (N) using a number of pre-breakdown gain distributions defined by $\Gamma_{n<1} = A\Gamma_{n<1}$, with A set to the values 1, 2, 3 and 4. $G_M$ increases with A. However, the maximum useful value of A is limited by breakdown occurring in some stage other than stage 1. FIG. 18 shows the gain distribution in a 5 stage system, calculated using A values of 1, 2, 3 and 4. As A is increased, the gain (and hence feedback) of the individual stages increases relative to the gain (and feedback) of stage 1. This behavior can be used to minimize system noise by minimizing the feedback (and hence noise) of the first stage of a multi stage amplifier.

Figure 19:
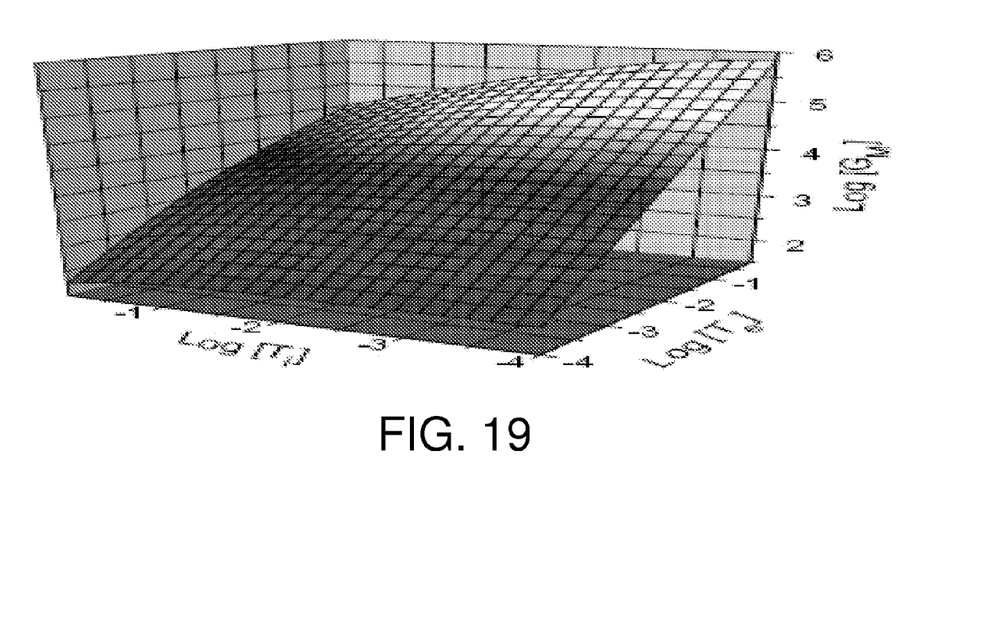
FIG. 19 is a graph showing the breakdown gain of a 2 stage system as a function of the electron and ion grid transmittances.

FIG. 19 is a graph showing the breakdown gain of a 2 stage system as a function of the electron and ion grid transmittances, calculated using $\kappa = 10^{-3}$. FIG. 19 shows that the breakdown gain of a two stage system is optimized by maximizing $T_e$ and minimizing $T_i$ of the electrode used to create the 2 amplification stages.

Figure 20:
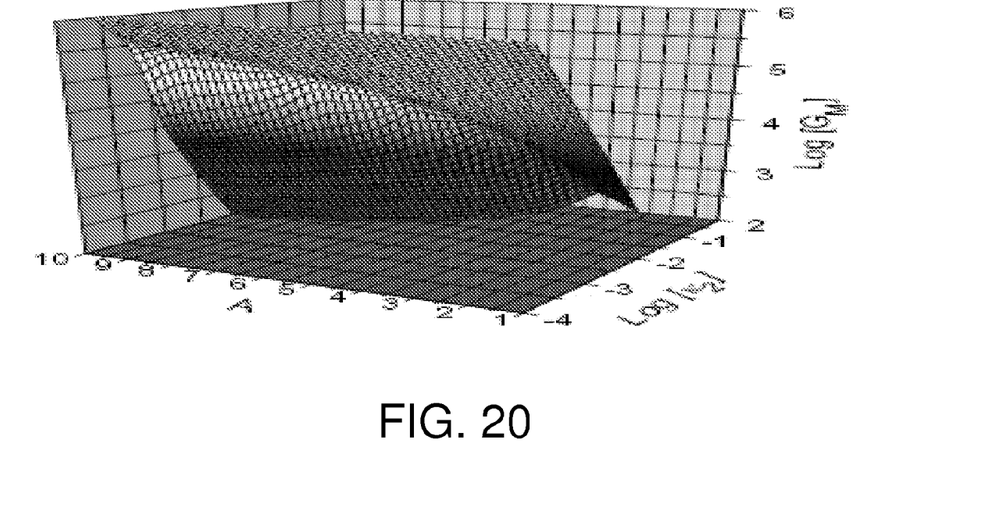
FIG. 20 is a graph showing the breakdown gain of a 2 stage system as a function of the electron ejection probability from a grid impacted by ions, and the pre-feedback gain ratio of stage 2 relative to stage 1.

FIG. 20 is a graph showing the breakdown gain of a 2 stage system as a function of the electron ejection probability ($\kappa_2$) of a grid impacted by an ion, and the pre-feedback gain ratio of stage 2 relative to stage 1, defined by $\Gamma_{n=2} = A\delta_{n=1}$ (in this system, $T_e = T_i = 0.1$). FIG. 20 shows that the breakdown gain of a two stage system is optimized by simultaneously minimizing $\kappa_2$ and maximizing A. That is, optimal breakdown gain is achieved when the gain of stage 2 is greater than the gain of stage 1.

The operating parameters, such as gas type and pressure and electrode biases and geometries, can be readily determined by skilled persons for various implementations. The gas pressure typically ranges from 0.01 Torr (0.013 mbar) to 50 Torr (67 mbar). While the invention can be used with most gases, preferred gases include $H_2O$, air, $N_2$, $O_2$, $N_2O$ and $CO_2$. Spacing between conductive elements defining the different amplification stages are typically between 0.1 mm and 100 mm. Anodes are typically biased to between about 50 V and 2000 V, relative to the sample. These numbers are guides for preferred embodiments, and not limitations on the invention.

While the examples provided herein show the use of grids to define the different amplification stages, the amplification stages could be defined by a different series of electrodes, such as membranes or needle-shaped electrodes. Although the present invention and its advantages have been described in detail, it should be understood that various changes, substitutions and alterations can be made herein without departing from the spirit and scope of the invention as defined by the appended claims. While detectors having up to four stages are described, and up to seven stages are analyzed using the above feedback model, it is clear that the invention can use any number of stages. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
   a sample chamber for containing a sample at a sample position;
   a charged particle beam source including a focusing column for forming a beam of charged particles and directing the beam toward the sample chamber; and
   a detector for detecting an electron signal emitted as the charged particle beam impacts the sample, the detector comprising:
   a detector volume;
   an anode positioned toward the rear of the detector volume;
   a first electrode positioned between a sample position and the anode; and
   a second electrode positioned between the first electrode and the anode;
   the detector volume being defined by an electric field generated by electric potential differences between the sample position, the first electrode, the second electrode, and the anode, the detector amplifying by means of gas cascade amplification an electron imaging signal emitted as the charged particle beam impacts the sample.

2. The charged particle beam system of claim 1 further comprising a detector housing opening toward the sample, and in which the first electrode is positioned at the opening of the detector housing.

3. The charged particle beam system of claim 1 in which the first electrode, the second electrode, or both electrodes comprise a grid or a perforated membrane.

4. The charged particle beam system of claim 1 in which the detector volume defines multiple stages of gas amplification, the overall amplification of the multiple stages being greater than the amplification available from a single stage before dielectric breakdown of the gas.

5. The charged particle beam system of claim 1 in which the first electrode is electrically biased positive with respect to the sample, the second electrode is electrically biased positive with respect to the first electrode, and the anode is electrically biased positive with respect to the second electrode.

6. The charged particle beam system of claim 1 in which the second electrode is electrically floating.

7. The charged particle beam system of claim 1 in which the first electrode is semi-transparent to electrons accelerated towards the first electrode by an electric field inside the detector volume and is semi-transparent to gaseous ions generated between the first and the second electrodes and which drift towards the first electrode.

8. The charged particle beam system of claim 1 in which the second electrode is semi-transparent to electrons accelerated towards the second electrode by an electric field inside the detector volume and is semi-transparent to gaseous ions generated between the second electrode and the anode and which drift towards the second electrode.

9. The charged particle beam system of claim 1, further comprising a third electrode positioned between the second electrode and the anode.

10. The charged particle beam system of claim 1, further comprising an imaging system connected to any combination of the anode, the first electrode, the second electrode and the sample.

11. The charged particle beam system of claim 1, further comprising an additional electrode positioned to detect the signal induced by the motion of charge carriers generated in the gas cascade.

12. The charged particle beam system of claim 1, further comprising a photon detector use to collect photons generated in the gas cascade.

13. The charged particle beam system of claim 1 in which at least one of the electrodes is made from or coated with carbon.

14. A gas cascade amplification detector for use in a charged particle beam system, comprising:
   a housing having an opening;
   a first electrode adjacent the opening of the housing;
   an anode positioned within the housing; and
   a second electrode positioned within the housing between the first electrode and the anode, the first and second electrodes being semi-transparent to electrons and positioned so that when electrical potentials are applied to the first electrode, the second electrode, and the anode, regions between the electrodes provide multiple stages of gas cascade amplification, the combined amplification being greater than the maximum amplification available in a single stage.

15. The gas cascade amplification detector of claim 14 in which the first electrode, the second electrode, or both electrodes comprise a grid or a perforated membrane.

16. The gas cascade amplification detector of claim 14 in which the second electrode is electrically biased positive with respect to the first electrode, and the anode is electrically biased positive with respect to the second electrode.

17. The gas cascade amplification detector of claim 14 further comprising at least one additional electrode positioned between the second electrode and the anode.

18. A method of forming an image of a sample in a scanning electron microscope, comprising:
   providing a first gas cascade amplification region to amplify an electron signal from a sample, the first gas cascade amplification region being defined by an electric potential difference between a sample and a first electrode;
   providing a second gas cascade amplification region to amplify electrons from the first amplification region, the second gas cascade amplification region being defined by an electric potential difference between the first electrode and a second electrode;
   providing a third gas cascade amplification region to amplify electrons from the second amplification region, the third gas cascade amplification region being defined by an electric potential difference between the second electrode and a third electrode; and
   forming an image of the sample corresponding to the amplified electron signal,
   whereby the electric potential at the first electrode is greater than the electric potential at the sample surface, the electric potential at the second electrode is greater the electric potential at the first electrode, and the electric potential at the third electrode is greater the electric potential at the second electrode.

19. The method of claim 18 further comprising providing at least one additional gas cascade amplification region to amplify electrons from the prior region.

20. The method of claim 18 further comprising neutralizing gaseous ions, the neutralized gaseous ion being generated at a potential that is greater than that of the nearest electrode between where the gaseous ion is generated and the sample, the neutralization occurring during contact with one of the electrodes between where the gaseous ion is generated and the sample.

21. The method of claim 18 further comprising neutralizing gaseous ions generated at a potential that is greater than that of the first electrode by contact with the first electrode.

22. The method of claim 18 further comprising neutralizing gaseous ions generated at a potential that is greater than that of the second electrode by contact with the first or the second electrode.

23. The method of claim 18 in further comprising neutralizing gaseous ions generated at a potential that is greater than that of the first electrode by contact with an electrode at a potential greater than or equal to that of the first electrode.

24. The method of claim 18 in which gaseous ions generated at a potential that is greater than that of the second electrode neutralize during contact with an electrode at a potential greater than or equal to that of the second electrode.

25. The method of claim 18 in which the gas cascade regions amplify electrons in a serial fashion, whereby the output of each region, prior to the final amplification region, is amplified by a subsequent region.

26. The method of claim 18 in which forming an image of the sample corresponding to the amplified electron signal includes forming an image in which the intensity of points in the image corresponds to an imaging signal collected from one or more of the gas cascade amplification regions.

27. The method of claim 26 in which the imaging signal is an electrical signal induced in an electrode, an electron current collected by an anode, an ion current collected by a cathode, or luminescence generated by the gas cascade.

28. A multi-stage gas cascade amplification detector for a scanning electron microscope, comprising:
   a first gas cascade amplification region defined by a first electric field region having a first gain; and
   a second gas cascade amplification region being defined by a second electric field region and having a second gain, the second gain being greater than one half of the first gain.

29. The detector of claim 28 in which the first electric field region is located between a sample and a first electrode and in which the second electric field region is located between first electrode and an anode.

30. The detector of claim 28 in which the second gain is greater than the first gain.

31. The detector of claim 28, further comprising one or more additional gas cascade amplification regions defined by additional electric field regions between the sample and the anode, the overall gain from all the gas cascade amplification regions being greater than the maximum gain of a single region before dielectric breakdown of the gas.

32. The detector of claim 28, in which the first electrode is semitransparent to electrons.

33. A charged particle beam system, comprising:
   a sample chamber;
   a charged particle beam column for directing charged particles towards a sample in the sample chamber; and
   a detector in accordance with claim 28.

34. A multi-stage, gas cascade amplification detector for a scanning electron microscope, comprising:
   a detector housing having an opening;
   a first electrode adjacent the opening of the housing; and
   an anode positioned within the housing, the first electrode being semi-transparent to electrons and positioned so that when electrical potentials are applied to the first electrode and the anode, regions between the electrodes provide multiple stages of gas cascade amplification, the first electrode and anode being positioned so as to provide a gain between the first electrode and the anode of at least one half the gain available between a sample and the first electrode.

35. The multi-stage, gas cascade amplification detector of claim 34 in which the first electrode and anode are positioned so as to provide a gain between the first electrode and the anode of at least the gain available between the sample and the first electrode.

36. The multi-stage, gas cascade amplification detector of claim 34 further comprising at least one additional electrode positioned between the first electrode and the anode to provide additional stages of amplification.

* * * * *